United States Patent [19]
Kleinhenz et al.

[11] Patent Number: 5,592,412
[45] Date of Patent: Jan. 7, 1997

[54] ENHANCED DEEP TRENCH STORAGE NODE CAPACITANCE FOR DRAM

[75] Inventors: Richard Kleinhenz; Karl P. Muller; Klaus Roithner, all of Wappingers Falls; Masakatsu Tuschiaki, Fishkill, all of N.Y.

[73] Assignees: Siemens Aktiengesellschaft, Berlin and Munich, Germany; International Business Machines Corporation, Armonk, N.Y.; Kabushiki Kaisha Toshiba, Kanagawa-ken, Japan

[21] Appl. No.: 539,475

[22] Filed: Oct. 5, 1995

[51] Int. Cl.$^6$ .............................. G11C 11/24; H01L 21/70; H01L 27/108; H01L 29/00
[52] U.S. Cl. .............................. 365/149; 437/52; 257/301; 257/532
[58] Field of Search .............................. 365/149; 437/52; 257/301, 532

[56] References Cited

U.S. PATENT DOCUMENTS

| | | | |
|---|---|---|---|
| 4,864,464 | 9/1989 | Gonzalez | 257/532 |
| 4,987,470 | 1/1991 | Suzuki et al. | 257/532 |
| 5,028,980 | 7/1991 | Teng | 257/532 |
| 5,093,702 | 3/1992 | Kim | 257/532 |
| 5,102,819 | 4/1992 | Matsushita et al. | 437/52 |
| 5,386,131 | 1/1995 | Sato | 257/301 |

*Primary Examiner*—David C. Nelms
*Assistant Examiner*—Trong Phan
*Attorney, Agent, or Firm*—Donald B. Paschburg

[57] ABSTRACT

A capacitance storage trench for a DRAM cell includes a trench having at least one sidewall, a bottom wall and a plurality of rods extending away from the bottom wall. The at least one sidewall, the bottom wall and the rods are coated with a capacitive dielectric layer. A layer of semiconductive material is disposed over the dielectric layer. The plurality of rods expand the overall surface area of the trench and thus, provide a significant increase in capacitance storage of the storage trench. The capacitance storage trench is formed in a method which includes the steps of forming a plurality of buried oxygen precipitates in a selected region of a substrate and using the oxygen precipitates as micromasks during a conventional trench etch process.

20 Claims, 2 Drawing Sheets

ENHANCED DEEP TRENCH STORAGE NODE CAPACITANCE FOR DRAM

FIELD OF THE INVENTION

The present invention relates generally to integrated circuits and more particularly to a capacitance storage trench for a DRAM cell having an expanded trench sidewall area.

BACKGROUND OF THE INVENTION

A typical dynamic random access memory (DRAM) comprises a plurality of storage cells that each include a data storage capacitor and an access transistor. Such structures are used as semiconductor memories.

DRAMs are generally implemented with one of two storage cell configurations. The first storage cell configuration comprises a "multilayer" capacitor structure formed on a semiconductor substrate. The other storage cell configuration comprises a "trench" capacitor structure formed on a semiconductor substrate. Since the "trench" capacitor structure allows for the highest density of memory cells per given area of semiconductor substrate, a preference for trench DRAM cells in various micro-electronic devices has been increasing steadily in recent years.

A typical capacitance storage trench for a DRAM cell comprises a cylindrical-shaped trench that is etched into the surface of a semiconductor substrate. Such a trench generally includes one sidewall that extends at a 90° angle as measured from the surface of the substrate and a bottom wall that extends parallel relative to the surface of the substrate. The sidewall of the trench, which is formed by the semiconductor substrate, operates as one of two plates of a capacitor. The sidewall of the trench is coated with a thin dielectric layer that functions as the dielectric medium of the capacitor. Polysilicon fills the trench and operates as the other plate of the capacitor.

Even though trench DRAM cells such as the one described above, lend themselves to high density integration, further increases in density are being sought. Such increases in density require reductions in the physical size of the memory cell which results in lower volt supply values. When lower volt supply values are used the value of the capacitance storage trench must be increased in order to maintain the capacitance of the memory cell.

As is well known in the art, in order to increase the capacitance of a capacitor, the area of the plates must be increased (assuming the thickness of the dielectric medium remains constant). This is presently accomplished in a capacitance storage trench by increasing the depth of the trench. Existing techniques for increasing the depth of the trench, however, are not capable of maintaining a 90° (vertical) trench sidewall angle as the depth of the trench is increased. Maintaining a 90° trench sidewall angle along the entire depth of the trench maximizes the area between the plates. Thus, for any given diameter trench, the depth of the trench is always limited to some value. If the trench depth is increased beyond this value, the gain in surface area between the plates becomes nominal because the trench sidewall angle beyond this trench depth becomes substantially less than 90°. Moreover, even if the depth of trenches can be successfully increased, as memory devices become denser, the depth of the trenches will eventually be limited.

Attempts have been made in the prior art to address the need for trench DRAM cells with increased capacitance. In U.S. Pat. No. 5,028,980 entitled TRENCH CAPACITOR WITH EXPANDED AREA, issued on Jul. 2, 1991 to Teng, there is disclosed a trench capacitor for a DRAM cell with an increased capacitance. The trench capacitor consists of a tubular-shaped trench formed in the semiconductor substrate. This type of trench structure produces a centrally located post of semiconductor material. The sidewall surface of the trench which includes the outer surface of the centrally located post, receives a thin layer of dielectric material. The trench is then filled with polysilicon. The outer surface of the centrally located post increases the overall surface area of the trench and thus, provides an increase in capacitance for the DRAM.

Although the trench DRAM cell of U.S. Pat. No. 5,028,980 provides a significant increase in capacitance, there still exists a need for trench DRAM cells with even greater increases in capacitance. This need is fueled by the ever increasing density of dynamic RAMs in today's microelectronic devices.

It is, therefore, an object of the present invention to provide a capacitance storage trench for a DRAM cell, with an expanded sidewall area that substantially increases the storage capacitance of the DRAM cell.

It is a further object of the present invention to provide a method for making a capacitance storage trench with an expanded sidewall area that is easily integrated into a trench DRAM process.

SUMMARY OF THE INVENTION

A method for making a capacitance storage trench for a dynamic access memory cell, comprises the step of providing a substrate of semiconductive material having a surface. Next, a plurality of micromasks are formed within a selected region of the substrate spaced from the surface thereof. An etchant is then applied to a selected area of the surface of the substrate which overlies the micromasks to form a trench in the substrate. The trench formed in the substrate by the method includes at least one sidewall that extends into the substrate beyond the micromasks and a bottom wall. The trench further includes a plurality of rods which extend between the bottom wall of the trench and the micromasks.

BRIEF DESCRIPTION OF THE DRAWINGS

For a detailed understanding of the present invention, reference should be made to the following detailed description taken in conjunction with the accompanying drawings wherein:

Referring to FIG. 1, the capacitance storage trench of the present invention is fabricated by providing a semiconductor substrate 10 made from single crystal silicon, polycrystalline silicon or like semiconductor material and annealing it at approximately 1150° C. for about one (1) hour to outdiffuse oxygen from the substrate 10. This creates an oxygen depleted zone 14 that extends approximately five microns into the substrate 10 from a surface 12 thereof.

FIG. 2. illustrates the substrate 10 of FIG. 1 after a second processing step. As shown, a mask layer 16 consisting preferably of first, second and third respective pad films 18, 20 and 22 are sequentially deposited over the surface 12 of the substrate 10 using any suitable known technique such as low pressure chemical vapor deposition or the like. The first pad film 18 preferably comprises a thermal oxide layer having a thickness of approximately 80 angstroms. The second pad film 20 preferably comprises a layer of nitride having a thickness of approximately 2000 angstroms. The third pad film 22 preferably comprises a layer of tetraethoxysilane (TEOS) acts as a hard mask for the subsequent trench etch process. The preferred thickness of the TEOS pad film 22 is approximately 5000 angstroms.

FIG. 3 depicts the substrate 10 of FIG. 2 after patterning the mask layer 16. In particular, conventional photolithography techniques are used to remove a selected area 24 of the mask layer 16 to expose an underlying portion of the substrate where the trench of the present invention will be located.

In FIG. 4, oxygen has been implanted into the oxygen depleted zone 14 in an area spaced directly below the exposed surface portion of the substrate 10. The portion of the substrate covered by the mask layer 16 comprised of the pad films 18, 20, and 22, blocks the oxygen ions during the oxygen implantation process. Oxygen implantation is accomplished using conventional techniques such as ion implantation or the like. The substrate structure resulting from this processing step is depicted in FIG. 5. As shown therein, a boxed in area 26 represents where concentrated oxygen has been introduced into the oxygen depleted zone 14 during the oxygen implantation process.

FIG. 6, depicts the substrate 10 after being precipitation annealed at a temperature of approximately 650° C. for about two (2) hours. The precipitation annealing process converts the concentrated oxygen ions 26 into a plurality of spaced apart $SiO_2$ precipitates 28. Each individual $SiO_2$ precipitate 28 operates as a micromask as will be described in greater detail immediately below.

In FIG. 7, the trench of the capacitance storage trench of present invention is formed after performing a conventional anisotropic trench etch. The trench, denoted by numeral 29, has a generally cylindrical sidewall 30 which extends into the substrate at approximately a 90° angle as measured from the surface 12 of the substrate 10. The trench 29 includes a bottom wall 32 that extends generally perpendicular to the sidewall 30 of the trench 29. The bottom wall 32 includes a plurality of unitarily formed rods 34 which project up from the bottom wall 32 and extend toward the opening of the trench 29. The rods 34 are created by using an anisotropic etchant that is selected to remove only the unmasked portion of the substrate 10 and not the substrate material directly under the $SiO_2$ precipitates 28. Accordingly, the $SiO_2$ precipitates 28 operate as micromasks during the trench etch process to form the rods 34 which originate from the bottom wall 32 of the trench 29. Each rod 34 shown in FIG. 7 is generally tubular in cross-section and defines a single sidewall. In other exemplary embodiments of the present invention, the rods can also be square or diamond shape in cross-section depending upon the shape of the individual $SiO_2$ precipitates. Such shaped rods would have more than one sidewall. The surface area provided by the sidewall(s) of each rod 34 increases the overall surface area of the trench 29. Hence, the capacitance storage of the trench of the present invention is significantly increased without having to resort to increasing the depth of the trench. Since the capacitance storage trench of the present invention can store substantially the same capacitance as a capacitance storage trench having a deeper trench, DRAM cells incorporating the capacitance storage trench of the present invention can be packed significantly more densely, providing a larger memory array.

At this point of the process, the sidewall 30 of the trench 29 and the sidewalls of the rods 34 can be optionally doped using standard techniques, to produce a desired conductivity.

Figure 2:
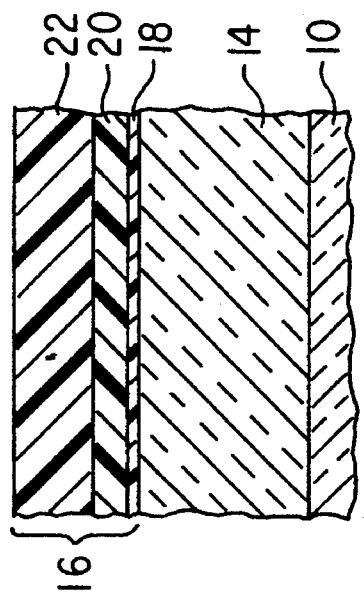
FIG. 2 depicts a cross-sectional side view through the substrate of FIG. 1 after the formation of a mask layer.
Figure 4:
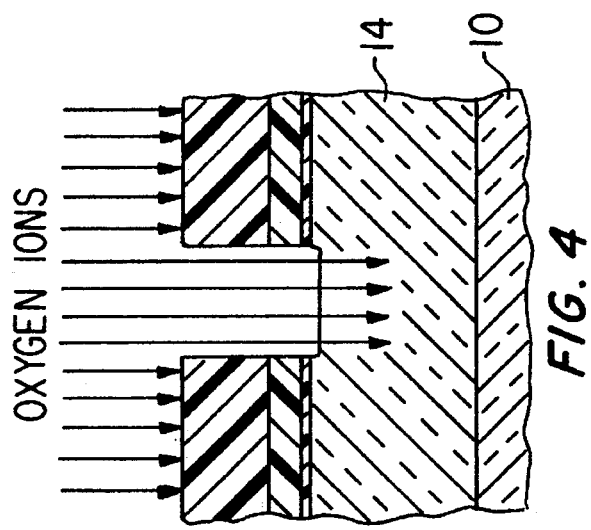
FIGS. 4 and 5 depict cross-sectional side views through the substrate of FIG. 3 after oxygen implantation.
Figure 1:
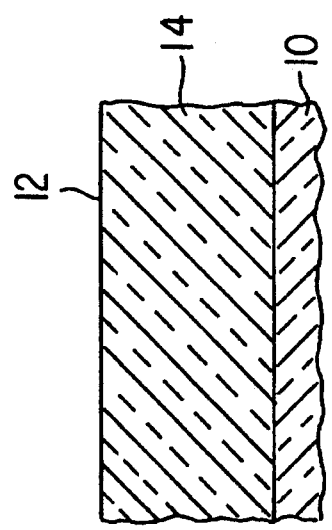
FIG. 1 depicts a cross-sectional side view through a substrate where the capacitance storage trench of the present invention will be formed.
Figure 3:
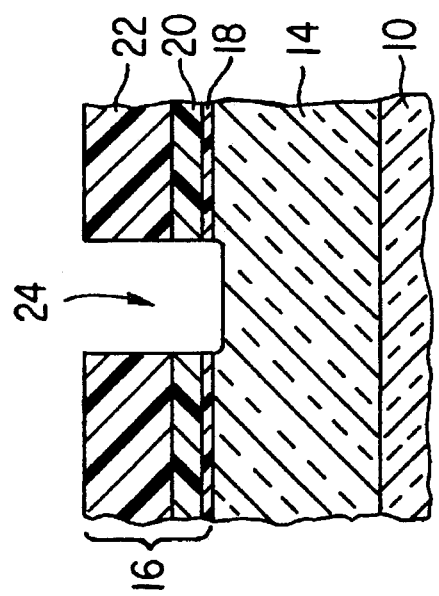
FIG. 3 depicts a cross-sectional side view through the substrate of FIG. 2 after patterning the mask layer.
Figure 6:
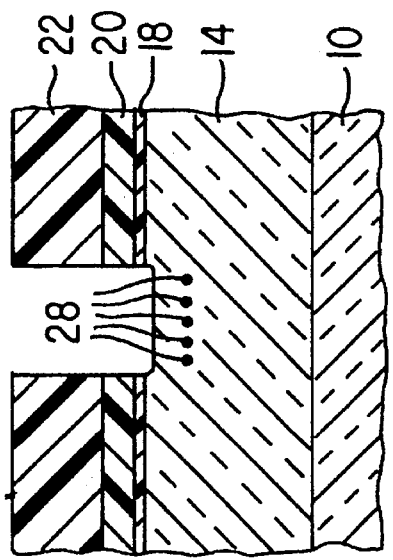
FIG. 6 depicts a cross-sectional side view through the substrate of FIG. 5 after a precipitation annealing process has been performed.
Figure 8:
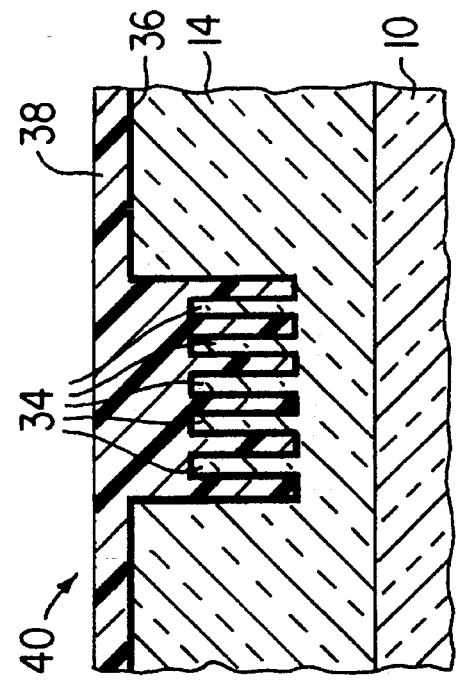
FIG. 8 depicts a cross-sectional side view through the substrate of FIG. 7 showing an exemplary embodiment of the capacitance storage trench of the present invention.
Figure 5:
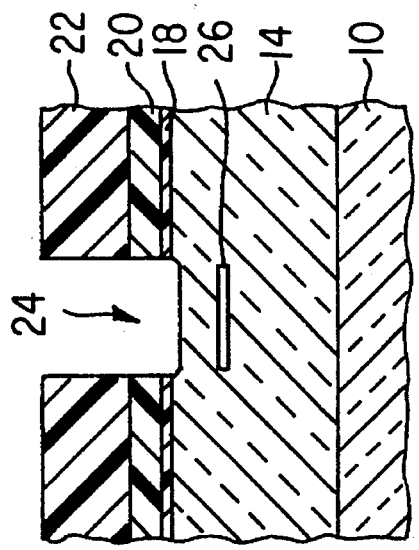
Figure 7:
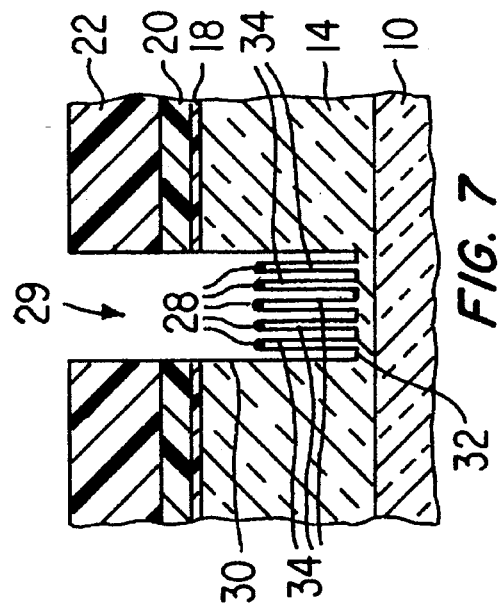
FIG. 7 depicts a cross-sectional side view through the substrate of FIG. 6 after a trench etch has been performed.

An exemplary embodiment of the capacitance storage trench of the present invention is shown FIG. 8 as reference by numeral 40. As can be seen, the mask layer and the $SiO_2$ precipitate micromasks have been removed using conventional etching techniques. Further, a thin capacitor dielectric layer 36 has been deposited on all of the surfaces of the trench 29 including the rods 34 and the trench 29 filled with a polysilicon layer 38 which forms the second plate of the capacitance storage trench 40 of the present invention (the trench 29 and rods 34 form the first plate of the capacitance storage trench). The capacitor dielectric layer 36, which has a thickness of approximately 100–200 angstroms, is deposited using standard techniques. The polysilicon layer 38 is deposited using conventional techniques such as low pressure vapor deposition.

As one of ordinary skill in the art should recognize, the method described above for making the capacitance storage trench of the present invention integrates well with standard trench DRAM processing techniques.

It should be understood that the embodiment described herein is merely exemplary and that a person skilled in the art may make many variations and modifications to the embodiment utilizing functionally equivalent elements to those described herein. For example, although the shape of the trench shown in the exemplary embodiment of the present invention as cylindrical, it should be understood, that other trench geometries such as square or rectangular are also contemplated in the present invention.

In any case, any and all such variations or modifications as well as others which may become apparent to those skilled in the art, are intended to be included within the scope of the invention as defined by the appended claims.

We claim:

1. A method for making a capacitance storage trench for a dynamic random access memory cell, comprising the steps of:

providing a substrate of semiconductive material having a surface;

forming a plurality of micromasks within a selected region of said substrate spaced from said surface; and applying an etchant to a selected area of said surface of said substrate which overlies said micromasks to form a trench in said substrate, said trench including at least one sidewall that extends into said substrate beyond said micromasks and terminates in a bottom wall, and a plurality of rods which extend between said bottom wall of said trench and said micromasks.

2. The method according to claim 1, wherein said step of forming a plurality of micromasks includes the step of forming an oxygen depleted layer in said substrate, said selected region being located in said oxygen depleted layer.

3. The method according to claim 2, wherein said step of forming a plurality of micromasks further includes the step of implanting oxygen in said selected region.

4. The method according to claim 3, wherein said step of forming a plurality of micromasks further includes the step of annealing said substrate to convert said oxygen into oxygen precipitates which form said plurality of micromasks.

5. The method according to claim 1, wherein said substrate of semiconductive material is silicon.

6. The method according to claim 5, wherein each of said micromasks comprises a silicon dioxide precipitate.

7. The method according to claim 6, wherein said etchant is selective to said silicon dioxide precipitate.

8. The method according to claim 1, wherein said step of forming a plurality of micromasks includes the steps of:

annealing said substrate;

applying a mask layer over said surface of said substrate; and patterning said mask layer to exposed said selected area of said surface.

9. The method according to claim 8, wherein said step of forming a plurality of micromasks further includes the step of implanting oxygen into said selected region.

10. The method according to claim 9, wherein said step of forming a plurality of micromasks further includes the step of annealing said substrate to convert said oxygen to oxygen precipitates which form said plurality of micromasks.

11. The method according to claim 1, wherein said substrate of semiconductive material has a predetermined conductivity.

12. The method according to claim 1, further comprising the step of depositing a layer of dielectric material over said at least one sidewall, said bottom and said rods of said trench.

13. The method according to claim 12, further comprising the step of depositing a layer of semiconductive material over said layer of dielectric material.

14. The method according to claim 13, wherein said layer of semiconductive material has a predetermined conductivity.

15. The method according to claim 1, wherein said each of said rods defines at least one sidewall.

16. A capacitance storage trench for a dynamic random access memory cell, comprising:

a substrate of semiconductive material having a trench formed therein, said trench including at least one sidewall, a bottom wall that insects with said at least one sidewall and a plurality of rods extending away from said bottom wall;

a dielectric layer disposed over said at least one sidewall, said bottom wall and said rods; and a layer of semiconductive material disposed over said dielectric layer.

17. The capacitance storage trench of claim 16, wherein said substrate of semiconductive material has a predetermined conductivity.

18. The capacitance storage trench of claim 16, wherein said layer of semiconductive material has a predetermined conductivity.

19. The capacitance storage trench of claim 16, wherein said rods are formed from said substrate of said semiconductive material.

20. The capacitance storage trench of claim 19, wherein each of said rods defines at least one sidewall.

* * * * *